United States Patent
Belot et al.

(10) Patent No.: US 7,554,381 B2
(45) Date of Patent: Jun. 30, 2009

(54) MIXER AMPLIFIER AND RADIOFREQUENCY FRONT-END CIRCUIT

(75) Inventors: Didier Belot, Rives (FR); Francesco Svelto, Pavia (IT); Marco Sosio, Tirano (IT); Massimo Brandolini, Laguna Niguel, CA (US)

(73) Assignee: STMicroelectronics SA, Montrouge (FR)

( * ) Notice: Subject to any disclaimer, the term of this patent is extended or adjusted under 35 U.S.C. 154(b) by 53 days.

(21) Appl. No.: 11/818,903

(22) Filed: Jun. 15, 2007

(65) Prior Publication Data

US 2008/0042726 A1 Feb. 21, 2008

(30) Foreign Application Priority Data

Jun. 20, 2006 (FR) .................................. 06 05496

(51) Int. Cl.
*G06F 7/44* (2006.01)
(52) U.S. Cl. ........................ 327/359; 327/355
(58) Field of Classification Search ........................ None
See application file for complete search history.

(56) References Cited

U.S. PATENT DOCUMENTS

| | | | | |
|---|---|---|---|---|
| 5,604,927 A | * | 2/1997 | Moore | 455/266 |
| 5,630,228 A | * | 5/1997 | Mittel | 455/326 |
| 6,094,084 A | * | 7/2000 | Abou-Allam et al. | 357/359 |
| 6,178,320 B1 | * | 1/2001 | Richards et al. | 455/326 |
| 6,388,502 B2 | * | 5/2002 | Kaneki et al. | 327/359 |
| 7,088,169 B2 | * | 8/2006 | Erba et al. | 327/359 |
| 2002/0004376 A1 | | 1/2002 | Lee et al. | |
| 2003/0112049 A1 | | 6/2003 | Wang | |
| 2003/0184366 A1 | | 10/2003 | Yoshida | |
| 2004/0227559 A1 | | 11/2004 | Erba et al. | |

* cited by examiner

*Primary Examiner*—Cassandra Cox

(57) ABSTRACT

The mixer amplifier includes an amplification stage having a current source circuit and a plug filter adapted to modify the current circulating in the current source circuit. The amplification stage and a mixer stage amplify an incoming signal and transpose the frequency of the signal to a predetermined frequency. Resistors pairs measure the imbalance between two branches and have a relatively high value (thus creating a high-pass filter). When the branches are perfectly balanced, the voltage tapped by the non-inverting terminal of the operational amplifier A is zero. During an imbalance, this voltage rises. The output of the amplifier drives the TNP transistor T9, causing current to flow into branches to solicit the transistors T7 or T8 of the current source circuits and thus return the two branches to balance. Accordingly, a balance is maintained between the two branches by providing a feedback within the mixer amplifier.

17 Claims, 2 Drawing Sheets

MIXER AMPLIFIER AND RADIOFREQUENCY FRONT-END CIRCUIT

CROSS-REFERENCE TO RELATED APPLICATIONS

The present application is related to French Patent Application No. 06/05496, filed Jun. 20, 2006, entitled "MIXER AMPLIFIER AND RADIOFREQUENCY FRONT-END CIRCUIT PROVIDED WITH SUCH A MIXER AMPLIFIER". French Patent Application No. 06/05496 is assigned to the assignee of the present application and is hereby incorporated by reference into the present disclosure as if fully set forth herein. The present application hereby claims priority under 35 U.S.C. §119(a) to French Patent Application No. 06/05496.

TECHNICAL FIELD

The present disclosure relates to front-end circuits and, in particular, to telecommunication appliances such as mixer amplifiers for such circuits.

BACKGROUND

Mixer amplifiers are essential components for all transmitters and receivers operating at radio frequencies (RF) and are used in most communication systems. In particular, mixer amplifiers are used in cellular telephone and other types of telecommunication sets to transpose the frequency of a signal without modifying the information that it conveys.

In particular, on transmission, the mixers are used to transpose radio frequencies to a useful signal to be transmitted and delivered at an intermediate frequency. Conversely, in reception, mixers are used to transpose the RF frequency of a received signal to a relatively low intermediate frequency in order to be able to be processed by downstream electronic circuits.

Thus, two conventional operating modes can be distinguished for the mixer, on one hand in the uplink direction on transmission, which corresponds to the transposition of the frequency of the signal being processed from the intermediate frequency FI to the high frequencies and, on the other hand, in the downlink direction on reception, which corresponds to the transposition of the RF frequency to the intermediate frequency (FI). Currently, there are various types of mixer amplifiers that can be used to obtain such behaviour.

Conventional active circuits for producing front-end circuits are advantageous because they can be used to obtain a very compact integration. Conventional active circuits, however, exhibit relatively mediocre noise and linearity performance characteristics. In particular, the mixer requires, on reception, high performance characteristics in terms of linearity and noise.

In this respect, the second order linearity of a mixer amplifier, which is defined by the point of interception of the tangent of the input power at the first harmonic with the tangent of the input power at the second harmonic, in their linear zones, and which qualifies the spectral purity of the mixer amplifier, is a parameter that must be mastered.

SUMMARY

Embodiments of the present disclosure generally provide a mixer amplifier exhibiting an enhanced spectral purity and, in particular, the greatest possible second order spectral linearity.

In one embodiment, the present disclosure provides a mixer amplifier. The mixer amplifier includes an amplification stage having a current source circuit and a plug filter adapted to modify the current circulating in the current source circuit. The mixer amplifier also includes a mixer stage. The amplification stage and the mixer stage amplify an incoming signal and transpose the frequency of the signal to a predetermined frequency.

In another embodiment, the present disclosure provides a radiofrequency front-end circuit for use in a telecommunication appliance. The circuit includes a mixer amplifier. The mixer amplifier includes an amplification stage having a current source circuit and a plug filter adapted to modify the current circulating in the current source circuit. The mixer amplifier also includes a mixer stage. The amplification stage and the mixer stage amplify an incoming signal and transpose the frequency of the signal to a predetermined frequency.

In still another embodiment, the present disclosure provides a a method of amplifying an incoming signal and transposing a frequency of the signal to a predetermined frequency for use in a radiofrequency front-end circuit. The method includes using an amplification stage having a current source circuit and a plug filter adapted to modify the current circulating in the current source circuit. The method also includes amplifying an incoming signal and transposing the frequency of the signal to a predetermined frequency using the amplification stage and a mixer stage.

Other technical features may be readily apparent to one skilled in the art from the following figures, descriptions and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

Figure 1:
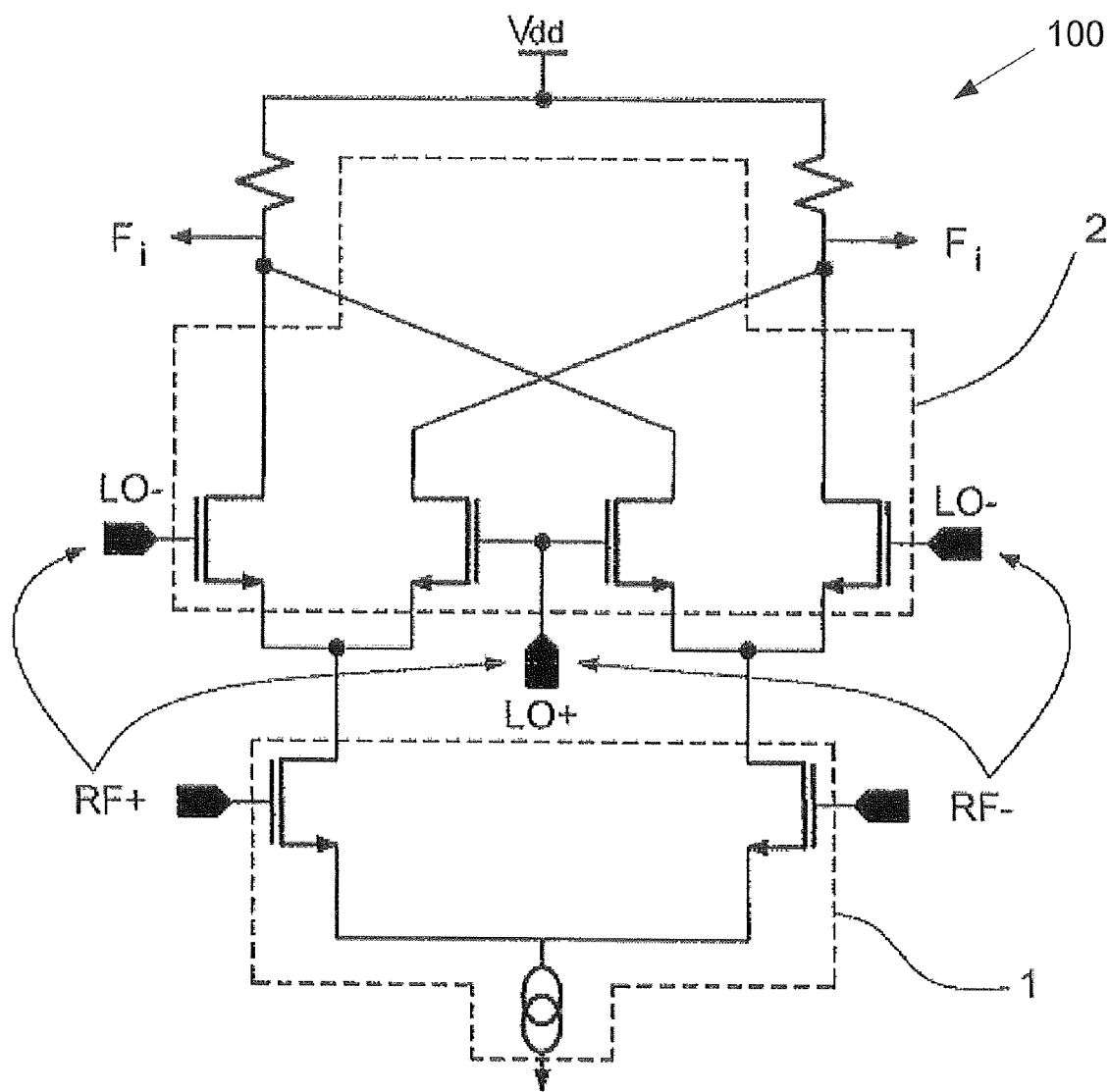
FIG. 1 illustrates the general structure of a conventional mixer amplifier.

FIG. 1 is the general structure of a conventional mixer amplifier 100. Conventional mixer amplifier 100 mainly comprises an amplifier stage 1 and a mixer stage 2 used jointly, according to the mode of operation of the radiofrequency front-end circuit in which it is integrated, either to offset the frequency of the useful signal from the baseband to the high frequencies, on transmission, or to offset the high frequency of the received useful signal to the baseband so that it can subsequently be processed, on reception.

Those skilled in the art will recognize that the mixer amplifier 100 illustrated in FIG. 1 corresponds to a Gilbert cell type mixer. As can be seen in FIG. 1, a mixer 100 has two ports for the useful frequencies, namely for the intermediate frequency FI and for the radiofrequency RF, and one port for a reference signal obtained from a local oscillator LO with which the input signal is multiplied. After the input signal and the signal from the local oscillator have been multiplied, two new frequencies are generated, one formed by the sum of the frequencies of the input signal and of the reference signal, and the other formed by the difference between these two frequencies. Depending on the mode of operation to be obtained, it is possible to select, by filtering, either the high frequency or the low frequency, in order to eliminate the frequency component that is not of interest to the conversion involved.

As indicated previously, a Gilbert cell mixer amplifier exhibits relatively mediocre linearity performance characteristics. In particular, the second order linearity, or IIP2 ("Input Interception Point 2"), is relatively mediocre. Furthermore, as illustrated by the arrows F, at the frequencies involved, there is a coupling between the high frequency input ports and the input port for the reference signal obtained from the local oscillator.

There is also a coupling between the port for the useful signal at intermediate frequency and the port for the signal from the local oscillator, and a coupling between the port for the useful signal at intermediate frequency and the useful signal at high frequency RF. These couplings induce a mixing of the signals, in particular because of the coupling between the high frequency RF port and the local oscillator port. Finally, this type of mixer is the source of leaks in the transistors used in making up the mixer. These leaks tend to generate an imbalance which is likely to favour a multiple of a frequency.

Figure 2:
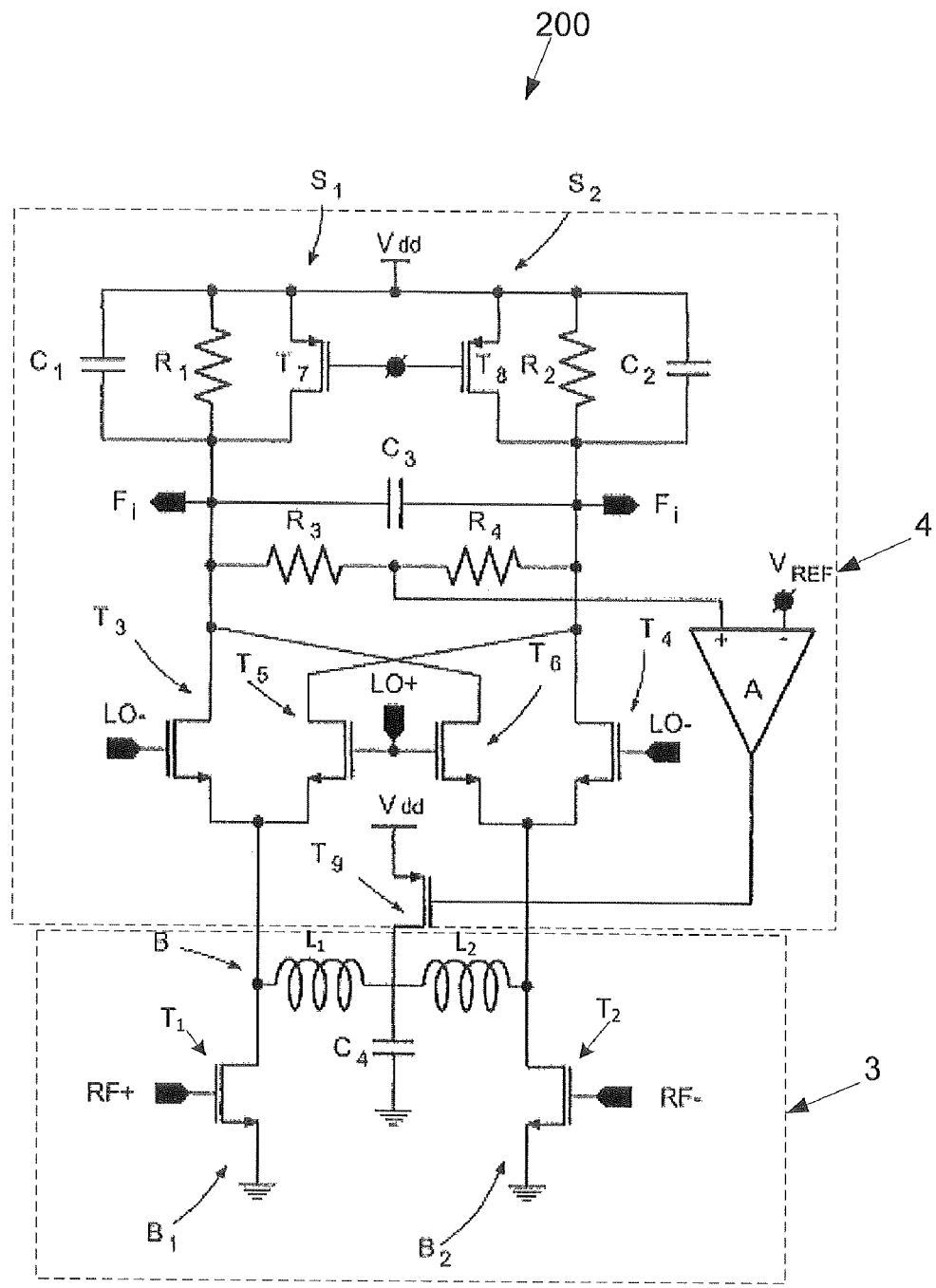
FIG. 2 is a somewhat simplified block diagram of a mixer amplifier according to one embodiment of the present disclosure.

With reference to FIG. 2, the mixer amplifier 200 according to one embodiment of the present disclosure includes an amplification stage 3 and a mixer stage 4. Mixer amplifier 200 is shown for illustration purposes only. Other embodiments of mixer amplifier 200 could also be used in accordance with the present disclosure.

In one embodiment, mixer amplifier 200 could be designed for a radiofrequency front-end circuit of a telecommunication set such as a mobile telephone set. Depending on the mode of operation of the front-end circuit, the mixer amplifier 200 is designed to convert to radiofrequency the frequency of a useful signal generated by telephony circuits at an intermediate frequency FI included in a baseband or, on reception, to transpose to the intermediate frequency FI the frequency of an incoming radiofrequency signal in order to allow for a subsequent signal processing by downstream processing circuits.

In other words, mixer amplifier 200 offsets the frequency of a signal by a signal from a local oscillator LO, upward on transmission, or downward on reception. In particular, after the signal has been multiplied by the signal obtained from the local oscillator, the converted signal obtained from the mixer 200 is generally shown by the relationship found in Equation 1 below.

$$\frac{1}{2} AB[\text{Cos}(\omega_{RF} - \omega_{OL})t + \text{Cos}(\omega_{RF} + \omega_{OL})t] \quad \text{(Eqn. 1)}$$

In Equation 1 above, A and B respectively denote the amplitude of the wanted signal to be converted and the amplitude of the signal from the local oscillator, while $\omega_{RF}$ and $\omega_{OL}$ denote the pulsing of the wanted signal and of the signal from the local oscillator.

In one embodiment, by filtering, according to the mode of operation of the front-end circuit, either the component Cos $(\omega_{RF}-\omega_{OL})$ t, on reception, or the component Cos $(\omega_{RF}+\omega_{OL})$ t on transmission, can be favored. As seen in FIG. 2, the mixer amplifier 200 is of Gilbert cell type and comprises two cells forming two symmetrical branches B1 and B2 arranged in parallel.

Regarding the amplification stage 3, the latter is constructed by the combination of two NMOS transistors T1 and T2, the gate of which receives the radiofrequency signals RF+ and RF−, the source of which is connected to ground and the drain of which is linked to the mixer stage 4.

As will be described in detail below, in one embodiment, the MOS transistors T1 and T2 constitute current source circuits that are designed, in operation, to be coupled to complementary current sources S1 and S2 of the mixer stage. Regarding this mixer stage, the latter mainly comprises two pairs of NMOS transistors operating in switching mode.

In one embodiment, the gate of a first transistor T3 and T4, respectively, of each pair, receives a signal LO− from a local oscillator whereas its source is connected to the drain of a corresponding transistor T1 or T2 of the amplification stage 3, and its drain is connected, on the one hand, to a corresponding current source circuit and, on the other hand, to an output or input terminal of the intermediate frequency IF signal.

According to one embodiment, each pair is also provided with a second NMOS transistor T5 or T6, the source of which is connected to the source of the first transistor T3 or T4, the drain of which is connected to the drain of the first transistor T3 or T4 of the other pair, and the gate of which receives a signal from the local oscillator LO+.

In one embodiment, the current source circuits S1 and S2 of each mixer stage are produced from a pair of PMOS transistors T7 and T8, the source S of which is connected to a DC voltage source $V_{dd}$ and the drain of which is connected to the drain of the first transistors T3 and T4 of each pair of transistors of the mixer stage 4.

It will also be seen in FIG. 2 that the gates of the two transistors T7 and T8 are connected, whereas the load resistors R1 and R2 associated with filtering capacitors C1 and C2 are connected in parallel between the source and the drain of each transistor T7 and T8.

In order to improve the spectral purity of the mixer amplifier 200 and, in particular, to obtain the greatest possible second order spectral linearity, by reducing the second order harmonics, the mixer amplifier is provided with a plug filter B inserted between the two branches B1 and B2. This plug filter B is associated with means for measuring the imbalance between the two branches B1 and B2. For this, a divider bridge, formed by the series association of two resistors R3 and R4 is positioned between the two branches B1 and B2, within the mixer stage.

In one embodiment, a capacitor C3 is placed in parallel with the two resistors R3 and R4. The common node between the two resistors R3 and R4 is connected to the non-inverting terminal of an operational amplifier A, the inverting terminal of which receives a controlling reference voltage $V_{ref}$. The output of the operational amplifier A is connected to the gate of a PMOS transistor T9 forming a current source, the source S of which is connected to a DC voltage source $V_{dd}$.

Finally, the filter is provided with two inductances L1 and L2 positioned in series between the two branches B1 and B2 and an optional capacitor C4, the function of which is mainly to increase the dynamic range of the RF transistors T1 and T2. The common node between the two inductances L1 and L2 is connected to the drain of the transistor T9.

It will be noted that the resistors R3 and R4 for measuring the imbalance between the branches B1 and B2 have a relatively high value, of the order of 10 k. For example, the capacitor C3 connected in parallel with these resistors has a value of the order of 520 pF. Thus a high-pass filter is created, making it possible to reduce the noise to 1/f of the mixer amplifier for a signal of frequency f. When the two branches B1 and B2 are perfectly balanced, the voltage tapped by the non-inverting terminal of the operational amplifier A is zero. Conversely, in the event of an imbalance, this voltage rises. In the case where it becomes greater than the reference voltage $V_{ref}$, reflecting an imbalance between the branches B1 and B2 and a consequent current difference between these two branches B1 and B2, the output of this amplifier drives the TNP transistor T9, which causes the injection of a current into the branches B1 and B2 so as to solicit the transistors T7 or T8 of the current source circuits and thus return the two branches to balance.

It can therefore be seen that one embodiment of the present disclosure makes it possible to maintain the balance between the two branches B1 and B2 by providing a feedback within the mixer amplifier.

Accordingly, embodiments of the present disclosure provide a mixer amplifier suitable for a radiofrequency front-end circuit of a telecommunication appliance, having an amplification stage and a mixer stage used jointly to amplify an incoming signal and to transpose the frequency of the signal to a predetermined frequency, the amplification stage including at least one current source circuit.

Embodiments of the mixer amplifier include a plug filter adapted to modify the current circulating in the current source circuit. Thus, when an imbalance appears within the mixer amplifier, and in particular between two branches of a Gilbert cell, the plug filter can, by current inrush, modify the behaviour of the mixer amplifier and, in particular, reduce the second order harmonics generated and amplified by the amplification stage. Thus, for example, the mixer stage and the amplification stage are advantageously produced in the form of a pair of cells in parallel, the plug filter then being able to be positioned between the two parallel cells.

Embodiments of the present disclosure could also include a plug filter including some means for detecting an imbalance between the two cells and a current source which is connected to the cells and which is driven by means for detecting the imbalance so as to modify the current circulating in each cell. The current source could be connected to each cell through an inductance. It is also possible to use a capacitor to ground the common node between the current source and the inductances.

In one embodiment, the means for detecting the imbalance between the two cells of the mixer amplifier comprise a comparator, of which one of the inverting and non-inverting terminals receives a potential level tapped between the two cells, and of which the other terminal receives an imbalance detection voltage threshold. For example, the two cells being linked via a branch of the circuit provided with two identical resistors, the voltage level is constituted by the voltage level tapped on the common node between the two resistors. For example, the mixer amplifier is produced from a Gilbert cell, preferably a doubly-balanced Gilbert cell.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A mixer amplifier comprising:
    an amplification stage having a current source circuit, a pair of cells in parallel, and a plug filter adapted to modify the current circulating in the current source circuit, wherein the plug filter comprises a detecting circuit to detect an imbalance between the two parallel cells and a current source connected to the cells, wherein the current source is driven by the detecting circuit and is modified according to the current circulating in each cell; and
    a mixer stage, wherein the amplification stage and the mixer stage amplify an incoming signal and transpose the frequency of the signal to a predetermined frequency.

2. The mixer amplifier according to claim 1, wherein the plug filter is positioned between the two parallel cells.

3. The mixer amplifier according to claim 1, wherein the current source is connected to each of the cells through an inductance.

4. The mixer amplifier according to claim 3, wherein the common node between the current source and the inductances is grounded through a capacitor.

5. The mixer amplifier according to claim 1, wherein the detecting circuit comprises a comparator, of which one of the inverting and non-inverting terminals receives a potential level tapped between the two cells, and of which the other terminal receives an imbalance detection voltage threshold.

6. The mixer amplifier according to claim 5, wherein the two cells are linked via a branch of the circuit provided with two identical resistors, and wherein the voltage level is constituted by the common point between the two resistors.

7. The mixer amplifier according to claim 1, wherein the mixer amplifier comprises a Gilbert cell.

8. The mixer amplifier according to claim 7, wherein the Gilbert cell is a doubly-balanced Gilbert cell.

9. For use in a telecommunication appliance, a radiofrequency front-end circuit comprising:
    a mixer amplifier comprising:
        an amplification stage having a current source circuit, a pair of cells in parallel, and a plug filter adapted to modify the current circulating in the current source circuit, wherein the plug filter comprises a detecting circuit to detect an imbalance between the two parallel cells and a current source connected to the cells, wherein the current source is driven by the detecting circuit and is modified according to the current circulating in each cell; and
        a mixer stage, wherein the amplification stage and the mixer stage amplify an incoming signal and transpose the frequency of the signal to a predetermined frequency.

10. The circuit according to claim 9, wherein the plug filter is positioned between the two parallel cells.

11. The circuit according to claim 9, wherein the current source is connected to each of the cells through an inductance.

12. The circuit according to claim 11, wherein the common node between the current source and the inductances is grounded through a capacitor.

13. The circuit according to claim 9, wherein the detecting circuit comprises a comparator, of which one of the inverting and non-inverting terminals receives a potential level tapped between the two cells, and of which the other terminal receives an imbalance detection voltage threshold.

14. The circuit according to claim 13, wherein the two cells are linked via a branch of the circuit provided with two identical resistors, and wherein the voltage level is constituted by the common point between the two resistors.

15. The circuit according to claim 9, wherein the mixer amplifier comprises a Gilbert cell.

16. The circuit according to claim 15, wherein the Gilbert cell is a doubly-balanced Gilbert cell.

17. For use in a radiofrequency front-end circuit, a method of amplifying an incoming signal and transposing a frequency of the signal to a predetermined frequency, the method comprising:

using an amplification stage having a current source circuit, a pair of cells in parallel, and a plug filter adapted to modify the current circulating in the current source circuit;

detecting an imbalance between the two parallel cells and a current source connected to the cells;

modifying the current circulating in each cell according to the imbalance; and amplifying an incoming signal and transpose the frequency of the signal to a predetermined frequency using the amplification stage and a mixer stage.

* * * * *